(12) United States Patent
Interrante et al.

(10) Patent No.: US 6,429,388 B1
(45) Date of Patent: Aug. 6, 2002

(54) HIGH DENSITY COLUMN GRID ARRAY CONNECTIONS AND METHOD THEREOF

(75) Inventors: Mario J. Interrante, New Paltz; Brenda Peterson; Sudipta K. Ray, both of Wappingers Falls; William E. Sablinski, Beacon; Amit K. Sarkhel, Endicott, all of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/564,110

(22) Filed: May 3, 2000

(51) Int. Cl.$^7$ .................................................. H01R 9/09
(52) U.S. Cl. ...................... 174/261; 439/65; 439/66; 439/75
(58) Field of Search ................. 174/261; 439/65, 66, 67, 68, 69, 70, 71, 72, 73, 74, 75, 874

(56) References Cited

U.S. PATENT DOCUMENTS

| | | | |
|---|---|---|---|
| 4,675,243 A | 6/1987 | Obinata et al. | 428/210 |
| 4,705,205 A * | 11/1987 | Allen et al. | 228/180.2 |
| 4,778,733 A | 10/1988 | Lubrano et al. | 428/647 |
| 4,806,309 A | 2/1989 | Tulman | 420/562 |
| 4,914,814 A * | 4/1990 | Behun et al. | 29/843 |
| 4,930,001 A * | 5/1990 | Williams | 357/71 |
| 5,324,892 A | 6/1994 | Granier et al. | 174/250 |
| 5,328,660 A | 7/1994 | Gonya et al. | 420/562 |
| 5,405,577 A | 4/1995 | Seelig et al. | 420/561 |
| 5,411,703 A | 5/1995 | Gonya et al. | 420/561 |
| 5,435,968 A | 7/1995 | Panthofer | 420/561 |
| 5,484,964 A * | 1/1996 | Dawson et al. | 174/261 |
| 5,527,628 A | 6/1996 | Anderson et al. | 428/647 |
| 5,658,528 A | 8/1997 | Ninomiya et al. | 420/562 |
| 5,733,501 A | 3/1998 | Takao et al. | 420/562 |
| 5,773,889 A * | 6/1998 | Love et al. | 257/737 |
| 5,863,493 A | 1/1999 | Achari et al. | 420/557 |
| 5,874,043 A | 2/1999 | Sarkhel et al. | 420/557 |
| 5,938,862 A | 8/1999 | Yeh et al. | 148/400 |
| 5,942,185 A | 8/1999 | Nakatsuka et al. | 420/562 |
| 5,958,333 A | 9/1999 | Matsunaga et al. | 420/562 |
| 6,016,947 A * | 1/2000 | Donahue et al. | 228/103 |
| 6,053,394 A * | 4/2000 | Dockerty et al. | 228/180.22 |

OTHER PUBLICATIONS

Anonymous; "Method of Forming Ohmic Contacts to Semiconductors"; Research Disclosure, Aug. 1989, No. 304, Kenneth Mason Publications Ltd, England.

* cited by examiner

*Primary Examiner*—Albert W. Paladini
(74) *Attorney, Agent, or Firm*—Margaret A. Pepper

(57) ABSTRACT

The present invention relates generally to a new semiconductor chip carrier connections, where the chip carrier and the second level assembly are made by a surface mount technology. More particularly, the invention encompasses surface mount technologies, such as, Ball Grid Array (BGA), Column Grid Array (CGA), to name a few, where the surface mount technology comprises essentially of a non-solder metallic connection, such as, a copper connection. The present invention is also related to Column Grid Array structures and process thereof.

14 Claims, 1 Drawing Sheet

HIGH DENSITY COLUMN GRID ARRAY CONNECTIONS AND METHOD THEREOF

FIELD OF THE INVENTION

The present invention relates generally to a new semiconductor chip carrier connections, where the chip carrier and the second level assembly are made by a surface mount technology. More particularly, the invention encompasses surface mount technologies, such as, Ball Grid Array (BGA), Column Grid Array (CGA), to name a few, where the surface mount technology comprises essentially of a non-solder metallic connection, such as, a copper connection. The present invention is also related to Column Grid Array structures and process thereof.

BACKGROUND OF THE INVENTION

Semiconductor devices are becoming smaller and more dense with the evolution of new technology. However, increases in circuit density produces a corresponding increase in overall challenges in chip connections. Chip manufacturers are therefore challenged to improve their products by constant innovations. Whereas significant improvements have been made in the chip interconnection technology, however, they alone are not sufficient to overcome all the concerns.

An area of the prior art where the current major innovations have been taken place are in the use of various Pb-free solder alloys as a connection between a chip and a substrate, and between a substrate and the next level interconnection.

For example, U.S. Pat. No. 5,328,660 (Gonya) discloses a lead-free, high temperature, tin based multi-component solder, where the solder alloy contains 78.4 weight percent tin and the balance being silver, bismuth and indium.

Similarly, U.S. Pat. No. 5,411,703 (Gonya) is directed to a lead-free, based multi-component solder, where the high solidus temperature solder alloy contains between 93 and 94 weight percent tin and the balance being antimony, bismuth and copper.

Whereas, U.S. Pat. No. 5,733,501 (Takao) discloses a fatigue testing of lead-free solder alloy, where a copper lead is passed through a hole in a glass epoxy resin copper laminate board/substrate and soldered by a solder alloy.

U.S. Pat. No. 5,874,043 (Sarkhel) discloses another lead-free high tin based multi-component solder, where the solder alloy contains between 70.5 to 73.5 weight percent tin and the balance being silver and indium.

Another area of innovation are the column grid array (CGA) chip carriers which are finding an increase use in chip carrier technologies, particularly when the chip carriers are made of a ceramic material. The chip carrier is typically made of a ceramic material or an organic laminate material. A plurality of solder columns are attached to the I/O (input/output) pads of the chip carrier and the next level package in order to provide an electrical connection between the two. See for example, U.S. Pat. No. 5,324,892 (Granier), assigned to International Business Machines Corporation, Armonk, N.Y., USA, and the disclosure of which is incorporated herein by reference, which teaches a method of fabricating an electronic interconnection, using solder columns. The solder columns are made of solder that has a melting point greater than about 250° C. The prefabricated solder columns are attached to a chip carrier by utilizing a solder that has a melting point of less than about 240° C. These solder columns are fabricated independently and loaded into a furnace fixture which is then aligned to the carrier. The high temperature solder columns are attached by reflowing the low temperature solder alloy. However, as a person skilled in the art would know that a solder column, which typically has a small diameter, is very soft, and as a result during fabrication of the chip carrier module, the columns can be easily damaged or bent. This problem gets compounded, especially if it is at multiple locations on the I/O pad array. Typical solution would be costly rework. Additionally, during card assembly these column grid array modules can be subjected to handling damages. And, as the interconnection density increases the solder column diameter would have to be reduced. This reduction in solder column diameter of course will lower the flexural strength of these solder columns and As one can see that the prior art uses a Pb-free solder system, but, none of them teach a non-solder metallic interconnection segment to connect a chip to a substrate or a substrate to a board. Similarly, they do not teach the use of a copper-core column array in combination with the use of high-melt and low-melt solder alloys for connecting such a copper column grid array to a chip carrier and an organic card. These high and low-melt solder alloys can be chosen from either Pb-containing or Pb-free solder alloys. Furthermore, this invention is directed to a column grid array types of structure which alleviate the problems of the prior art and enables the high volume manufacture of chip carriers with column grid array connections.

PURPOSES AND SUMMARY OF THE INVENTION

The invention is a novel method and a structure for a high density column grid array connections.

Therefore, one purpose of this invention is to provide a structure and a method that will provide a high density column grid array connections.

Another purpose of this invention is to provide a non-solder metallic interconnection.

Still another purpose of this invention is to provide a non-solder metallic interconnection between a chip carrier and an electronic component.

Yet another purpose of this invention is to provide a copper interconnection between a chip carrier and an electronic component.

Still yet another purpose of the invention is to provide a copper interconnection between a chip carrier and an electronic component using lead based attach solders, for example, 90/10 Pb/Sn for the substrate side and 37/63 Pb/Sn eutectic for the card side.

Yet another purpose of this invention is to provide a lead free solders, such as, tin/antimony for the substrate side and tin/silver/copper alloy for the card side, in order to provide a secure connection of the copper interconnection between the card and the substrate.

Therefore in one aspect this invention comprises a metallic electrical interconnect between a first pad on a first substrate and a second pad on a second substrate wherein said electrical interconnect is of a non-solder metallic material.

In another aspect this invention comprises a method of securing an interconnect to a substrate, wherein over at least fifty percent of said interconnect is of a non-solder metallic material, comprising the steps of:

(a) fluxing an end of said interconnect,
(b) placing said fluxed end of said interconnect on a pad with at least one solder on said substrate, (c) raising temperature from room temperature to between about 100° C. to about 300° C., near said fluxed end and said pad, and after reflowing said solder, bringing said interconnect to room temperature, and thereby securing said interconnect to said substrate.

In yet another aspect this invention comprises a method of securing an interconnect to a printed circuit board, wherein over at least fifty percent of said interconnect is of a non-solder metallic material, comprising the steps of:

(a) fluxing an end of said interconnect, (b) placing said fluxed end of said interconnect on a pad with at least one solder on said printed circuit board, (c) raising temperature from room temperature to between about 100° C. to about 300° C., near said fluxed end and said pad, and after reflowing said solder, bringing said interconnect to room temperature, and thereby securing said interconnect to said printed circuit board.

In still another aspect this invention comprises a method of securing an interconnect to a first substrate and a second substrate, wherein said interconnect is of a non-solder metallic material, comprising the steps of:

(a) fluxing a first end of said interconnect, (b) placing said first fluxed end of said interconnect on a first pad with at least one first solder on said first substrate, (c) raising temperature from room temperature to between about 100° C. to about 300° C., near said fluxed end and said first pad, and after reflowing said first solder, bringing said interconnect to room temperature, (d) fluxing a second end of said interconnect, (e) placing said second fluxed end of said interconnect on a second pad with at least one second solder on said second substrate, (f) raising temperature from room temperature to between about 100° C. to about 300° C., near said fluxed end and said second pad, and after reflowing said second solder, bringing said interconnect to room temperature, and thereby securing said interconnect to said first substrate and said second substrate.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1:
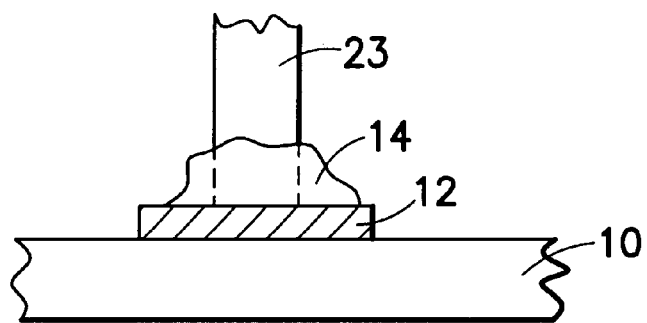
FIG. 1, illustrates a preferred embodiment of this invention.

FIG. 1, illustrates a preferred embodiment of this invention where a non-solder metallic column 23, such as, a copper column 23, is joined to an I/O (input/output) pad 12, on a chip carrier or substrate 10, using at least one high temperature solder material 14, resulting in a high density column structure.

Figure 2:
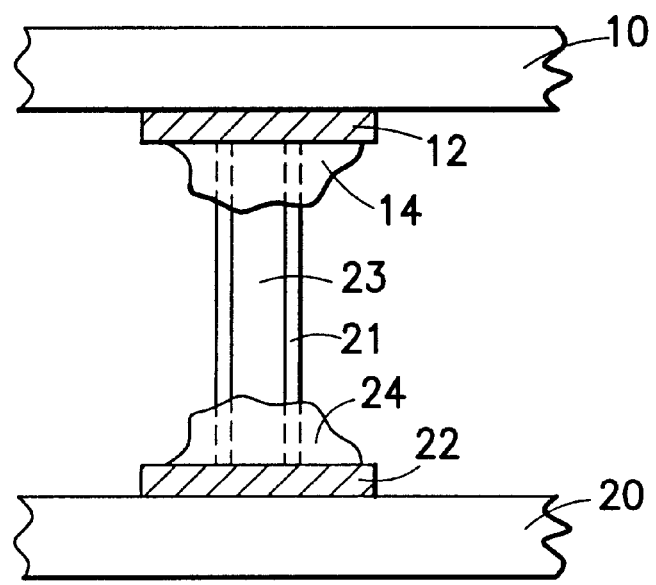
FIG. 2, illustrates another preferred embodiment of this invention.

FIG. 2, illustrates another preferred embodiment of this invention, where the high density column structure of FIG. 1, is joined to an I/O (input/output) pad 22, on a second level package or substrate 20, such as, a printed circuit board (PCB) 20, using at least one low temperature solder material 24. The non-solder metallic column 23, such as, a copper column 23, could also have at least one layer of thin metallic plating 21. The metallic plating 21, is usually a very thin plating and the preferred metal material is tin. However, one could use additional metallic plating 21, such as, for example, nickel, nickel with additional one or more layers of tin, tin-silver, tin-gold, and alloys thereof, to name a few.

As stated earlier this invention basically utilizes a non-solder metallic structure 23, such as, an array of flexible copper core columns 23, to join the chip carrier 10, with a high melting point solder alloy 14, and a lower melting point solder alloy 24, to organic card or board 20. The copper columns 23, are preferably fully annealed so that they have a high elongation rate such that they can absorb multiple thermal fatigue cycles that these chip carriers joined to organic cards typically undergo during product life It is preferred that the low and high melting point solder alloys used are compatible with the copper core column. The solder alloys used to secure the copper column can be made of either Pb-containing solder alloys or Pb-free solder alloys.

The high density column connections 23, are preferably of a fully annealed copper column segment 23, with elongation greater than about 30 percent. The optional coating 21, such as, tin, tin/silver, nickel or nickel/tin plated coating 21, preferably has a thickness of between about 0.5 $\mu$m to about 4.0 $\mu$m. However, the diameter and the length of the metal segment 23, and its associated solder joint fillet geometry can be customized for optimum fatigue life depending on the particular stress conditions of the modules functional environment. For most applications it is preferred that the diameter of the non-solder column 23, is between about 0.2 mm to about 0.5 mm. This would be a typical diameter for a non-solder column arrays with about 0.5 mm to about 1.27 mm pitch.

For joining the non-solder column 23, to the PCB or substrate 20, or chip carrier 10, a high melt solder, such as, lead/tin (with lead concentration in the range of between about 70 to about 90 weight percent) or eutectic lead tin doped with palladium could be used.

For a lead free system the solder 14, could be selected from a group comprising tin/antimony (with tin being between about 55 to about 95 weight percent), tin/silver, tin/silver/copper (with silver and copper being between about 0.5 to about 3.0 weight percent), tin/silver/bismuth (with silver being between about 2.0 to about 4.5 weight percent and bismuth being between about 3.5 to about 7.5 weight percent), tin/silver/copper (with silver being between about 2.0 to about 4.5 weight percent and copper being between about 0.5 to about 3.0 weight percent), to name a few.

For the PCB or card 20, eutectic lead/tin solder 24, has traditionally been used. However, for a lead free system the solder 24, could be selected from a group comprising tin/antimony (with tin being between about 55 to about 95 weight percent), tin/silver, tin/silver/copper (with silver and copper being between about 0.5 to about 3.0 weight percent), tin/silver/bismuth (with silver being between about 2.0 to about 4.5 weight percent and bismuth being between about 3.5 to about 7.5 weight percent), tin/silver/copper (with silver being between about 2.0 to about 4.5 weight percent and copper being between about 0.5 to about 3.0 weight percent), tin/zinc (with tin being about 91 weight percent), tin/bismuth (with tin being about 42 weight percent), to name a few.

The pure copper core 23, could be annealed to optimize it's strain properties, and optionally could be coated with nickel (say between about 0.5μ to about 4.0μ) followed by a tin flash (say between about 0.2 μ to about 0.5 μ).

To attach the non-solder column 23, to the I/O pad 12, one could use 95/5 Sn/Sb or Sn/Ag (with Ag in the range of between about 3 to about 5 weight percent), which melts in the range of between about 220° C. to about 240° C. This would be the high temperature lead-free solder join.

To attach the non-solder column 23, to the PCB I/O pad 22, one could use 48/52 Sn/In or 43/57 Sn/Bi, which melts in the range of between about 120° C. to about 140° C. This would be the low temperature lead-free solder join.

This type of a solder join hierarchy significantly minimizing any risks of reflowing the I/O solder joint 14, during card assembly.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A metallic electrical interconnect structure for connecting a first pad on a chip carrier substrate and a second pad on an organic board, comprising:

an electrically conductive column having a first end and a second end, said column being of a non-solder metallic material, the first end being connected to the first pad on the chip carrier substrate and the second end being connected to the second pad on the organic board;

a first solder material connecting the first end of the column to the first pad on the chip carrier substrate; and a second solder material connecting the second end of the column to the second pad on the organic board;

wherein said first solder material has a first melting temperature, and said second solder material has a second melting temperature less than the first melting temperature.

2. The interconnect structure of claim 1, wherein over at least fifty percent of said column is of a non-solder metallic material.

3. The interconnect structure of claim 1, wherein said column is selected from the group consisting of copper segment, pure copper segment and fully annealed copper segment.

4. The interconnect structure of claim 1, wherein said column comprises a material selected from the group consisting of copper, nickel and alloys thereof, and copper-tin alloys with tin in the range of between about 10 to about 20 weight percent.

5. The interconnect structure of claim 1, wherein said column has a diameter of about 0.2 mm to about 0.5 mm.

6. The interconnect structure of claim 1, wherein at least a portion of said column has at least one coating of at least one material.

7. The interconnect structure of claim 6 wherein said coating has a thickness of about 0.5 μm to about 4.0 μm.

8. The interconnect structure of claim 1, wherein at least a portion of said column has at least one coating of at least one material selected from the group consisting of copper, nickel, silver, tin and alloys thereof.

9. The interconnect structure of claim 1, wherein said column is secured to said chip carrier substrate using a method selected from the group consisting of solder and braze.

10. The interconnect structure of claim 1, wherein said column is secured to said organic board using a method selected from the group consisting of solder and braze.

11. The interconnect structure of claim 1, wherein said first solder material is an alloy with a melting temperature of greater than about 200° C., and said second solder material is an alloy with a melting temperature of less than about 200° C.

12. The interconnect structure of claim 1, wherein said first solder material is selected from the group consisting of tin/antimony (with tin being between about 55 to about 95 weight percent), tin/silver, tin/silver/copper (with silver and copper being between about 0.5 to about 3.0 weight percent), tin/silver/bismuth (with silver being between about 2.0 to about 4.5 weight percent and bismuth being between about 3.5 to about 7.5 weight percent) and tin/silver/copper (with silver being between about 2.0 to about 4.5 weight percent and copper being between about 0.5 to about 3.0 weight percent).

13. The interconnect structure of claim 1, wherein said second solder material is selected from the group consisting of tin/antimony (with tin being between about 55 to about 95 weight percent), tin/silver, tin/silver/copper (with silver and copper being between about 0.5 to about 3.0 weight percent), tin/silver/bismuth (with silver being between about 2.0 to about 4.5 weight percent and bismuth being between about 3.5 to about 7.5 weight percent), tin/silver/copper (with silver being between about 2.0 to about 4.5 weight percent and copper being between about 0.5 to about 3.0 weight percent), tin /zinc (with tin being about 91 weight percent), and tin/bismuth (with tin being about 42 weight percent).

14. The interconnect structure of claim 1, wherein said column has a uniform diameter.

* * * * *